United States Patent
Feng et al.

(10) Patent No.: US 9,520,855 B2
(45) Date of Patent: *Dec. 13, 2016

(54) BULK ACOUSTIC WAVE RESONATORS HAVING DOPED PIEZOELECTRIC MATERIAL AND FRAME ELEMENTS

(71) Applicant: Avago Technologies General IP (Singapore) Pte. Ltd., Singapore (SG)

(72) Inventors: Chris Feng, Fort Collins, CO (US); John Choy, Westminster, CO (US); Phil Nikkel, Loveland, CO (US); Kevin J. Grannen, Thornton, CO (US); Tina L. Lamers, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 171 days.

This patent is subject to a terminal disclaimer.

(21) Appl. No.: 14/190,361

(22) Filed: Feb. 26, 2014

(65) Prior Publication Data

US 2015/0244346 A1    Aug. 27, 2015

(51) Int. Cl.
*H03H 9/17* (2006.01)
*H03H 9/54* (2006.01)
(Continued)

(52) U.S. Cl.
CPC ...... *H03H 9/02031* (2013.01); *H03H 9/02118* (2013.01); *H03H 9/132* (2013.01);
(Continued)

(58) Field of Classification Search
CPC ............ H03H 9/02015; H03H 9/02031; H03H 9/02047; H03H 9/0211; H03H 9/02118; H03H 9/02133; H03H 9/172; H03H 9/173; H03H 9/175; H03H 9/562; H03H 9/587; H03H 9/589; H03H 9/132
(Continued)

(56) References Cited

U.S. PATENT DOCUMENTS

| 5,587,620 A | 12/1996 | Ruby et al. |
| 5,873,153 A | 2/1999 | Ruby et al. |

(Continued)

FOREIGN PATENT DOCUMENTS

KR    20110041814    4/2011

OTHER PUBLICATIONS

Johannes Enlund, "Fabrication of Electroacoustic Devices for Integrated Applicaitons," Acta Universitatis Upsaliensis, Digital Comprehensive Summaries of Uppsala Dissertations from the Faculty of Science and Technology 631, 2009, pp. 1-72.

(Continued)

*Primary Examiner* — Barbara Summons

(57) ABSTRACT

A bulk acoustic wave (BAW) resonator includes a first electrode; a second electrode; and a piezoelectric layer disposed between the first and second electrodes. The piezoelectric layer includes a piezoelectric material doped with at least one rare earth element. In an embodiment, the BAW resonator includes a recessed frame element disposed over a surface of at least one of the first and second electrodes. In another embodiment, the BAW resonator includes a raised frame element disposed over a surface of at least one of the first and second electrodes. In yet another embodiment, the BAW resonator includes both the raised and recessed frame elements.

27 Claims, 6 Drawing Sheets

(51) Int. Cl.
*H03H 9/02* (2006.01)
*H03H 9/13* (2006.01)
*H03H 9/56* (2006.01)

(52) U.S. Cl.
CPC ............ *H03H 9/172* (2013.01); *H03H 9/173* (2013.01); *H03H 9/175* (2013.01); *H03H 9/562* (2013.01)

(58) Field of Classification Search
USPC .................................................. 333/187–192
See application file for complete search history.

(56) References Cited

U.S. PATENT DOCUMENTS

| | | | |
|---|---|---|---|
| 6,107,721 A | 8/2000 | Lakin | |
| 6,507,983 B1 | 1/2003 | Ruby et al. | |
| 6,583,688 B2* | 6/2003 | Klee | H03H 3/04 310/358 |
| 6,828,713 B2 | 12/2004 | Bradley et al. | |
| 6,936,837 B2* | 8/2005 | Yamada | H03H 9/02094 257/2 |
| 7,280,007 B2 | 10/2007 | Feng et al. | |
| 7,345,410 B2 | 3/2008 | Grannen et al. | |
| 7,388,454 B2 | 6/2008 | Ruby et al. | |
| 7,629,865 B2 | 12/2009 | Ruby | |
| 7,714,684 B2 | 5/2010 | Ruby et al. | |
| 7,758,979 B2* | 7/2010 | Akiyama | B81B 3/0021 428/698 |
| 7,791,434 B2 | 9/2010 | Fazzio et al. | |
| 8,188,810 B2 | 5/2012 | Fazzio et al. | |
| 8,248,185 B2 | 8/2012 | Choy et al. | |
| 9,136,819 B2* | 9/2015 | Grannen | H03H 9/02047 |
| 9,214,623 B1* | 12/2015 | Thalmayr | H01L 41/18 |
| 9,219,464 B2* | 12/2015 | Choy | H03H 9/02015 |
| 9,225,313 B2* | 12/2015 | Bradley | H03H 9/02015 |
| 2007/0205850 A1 | 9/2007 | Jamneala et al. | |
| 2010/0327994 A1 | 12/2010 | Choy et al. | |
| 2011/0180391 A1 | 7/2011 | Larson, III et al. | |
| 2012/0177816 A1 | 7/2012 | Larson, III et al. | |
| 2012/0326807 A1 | 12/2012 | Choy et al. | |
| 2013/0127300 A1 | 5/2013 | Umeda et al. | |
| 2013/0176086 A1 | 7/2013 | Bradley et al. | |
| 2014/0125203 A1* | 5/2014 | Choy | H03H 9/02118 310/365 |
| 2014/0125432 A1* | 5/2014 | Stephanou | H03H 3/02 333/188 |
| 2014/0159548 A1* | 6/2014 | Burak | H03H 9/02118 310/346 |
| 2014/0225683 A1* | 8/2014 | Burak | H03H 9/173 333/187 |
| 2014/0232486 A1* | 8/2014 | Burak | H03H 9/175 333/187 |
| 2014/0354115 A1* | 12/2014 | Burak | H03H 9/175 310/348 |

OTHER PUBLICATIONS

Tuomas Pensala, "Thin Film Bulk Acoustic Wave Devices," VTT Publications 756, Feb. 2011, pp. 1-108.
Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Office Action mailed Dec. 10, 2014 in German Patent Application No. 102014105952.2 (Unofficial/Non-certified translation provided by foreign agent included).
Humberto Campanella Pineda, "Thin-film bulk acoustic wave resonators—FBAR", Bellaterra i Montpellier, Dec. 2007, chapters 2 and 3, pp. 27-131.
Ken-ya Hashimoto, "RF Bulk Acoustic Wave Filters for Communications", Artech House, 2009, chapters 3 and 4, pp. 51-113.

\* cited by examiner

BULK ACOUSTIC WAVE RESONATORS HAVING DOPED PIEZOELECTRIC MATERIAL AND FRAME ELEMENTS

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), solidly mounted resonators (SMRs), coupled resonator filters (CRFs), stacked bulk acoustic resonators (SBARs) and double bulk acoustic resonators (DBARs).

A typical acoustic resonator comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

One metric used to evaluate the performance of an acoustic resonator is its electromechanical coupling coefficient ($kt^2$), which indicates the efficiency of energy transfer between the electrodes and the piezoelectric material. Other things being equal, an acoustic resonator with higher $kt^2$ is generally considered to have superior performance to an acoustic resonator with lower $kt^2$. Accordingly, it is generally desirable to use acoustic resonators with higher levels of $kt^2$ in high performance wireless applications, such as 4G and LTE applications.

The $kt^2$ of an acoustic resonator is influenced by several factors, such as the dimensions, composition, and structural properties of the piezoelectric material and electrodes. These factors, in turn, are influenced by the materials and manufacturing processes used to produce the acoustic resonator. Consequently, in an ongoing effort to produce acoustic resonators with higher levels of $kt^2$, researchers are seeking improved approaches to the design and manufacture of acoustic resonators.

One method that is useful in improving the $kt^2$ of piezoelectric materials is by doping the piezoelectric material with a selected dopant, such as a rare-earth element. While doping the piezoelectric material can provide improvement in $kt^2$, in applications in BAW resonators, other parameters may be degraded as compared to BAW resonators that do not include doped piezoelectric materials.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
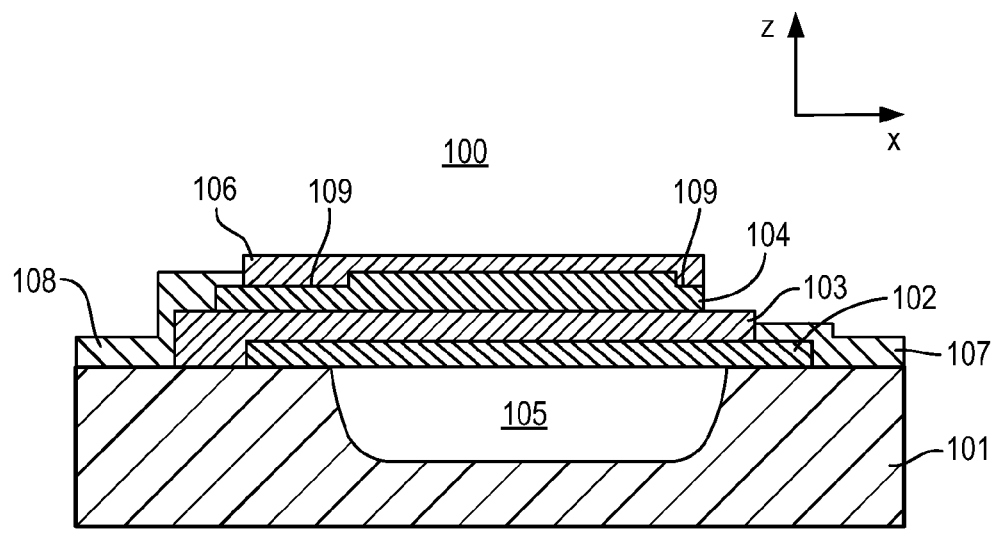
FIG. 1 is a cross-sectional view of a BAW resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Other relative terms may also be used to indicate the relative location of certain features along a path such as a signal path. For instance, a second feature may be deemed to "follow" a first feature along a signal path if a signal transmitted along the path reaches the second feature before the second feature.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434 and 8,188,810, to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Patent Application Publication 20120326807 to Choy, et al; U.S. Patent Application Publication 20100327994 to Choy, et al.; U.S. Patent Application Publications 20110180391 and 20120177816 to Larson III, et al.; U.S. Patent Application Pub. No. 20070205850 to Jamneala et al.; U.S. patent application Ser. No. 14/161,564 entitled: "Method of Fabricating Rare-Earth Element Doped Piezoelectric Material with Various Amounts of Dopants and a Selected C-Axis Orientation," filed Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; and U.S. patent application Ser. No. 13/906,873 entitled "Bulk Acoustic Wave Resonator having Piezoelectric Layer with Varying Amounts of Dopants" to John Choy, et al. and filed on May 31, 2013. The entire disclosure of each of the patents, published patent applications and patent application listed above are hereby specifically incorporated by reference herein. It is emphasized that the components, materials and methods of fabrication described in these patents and patent applications are representative and other methods of fabrication and materials within the purview of one of ordinary skill in the art are also contemplated.

The described embodiments relate generally to bulk acoustic wave (BAW) resonators. Generally, the BAW resonators comprise a first electrode; a second electrode; and a piezoelectric layer disposed between the first and second electrodes. The piezoelectric layer comprises a piezoelectric material doped with at least one rare earth element. In certain embodiments the piezoelectric layer comprises aluminum nitride (AlN) that is doped with scandium (Sc). The atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. When percentages of doping elements in a piezoelectric layer are discussed herein, it is in reference to the total atoms of the piezoelectric layer. Notably, when the percentages of doping elements (e.g., Sc) in a doped AlN layer are discussed herein, it is in reference to the total atoms (not including nitrogen) of the AlN piezoelectric layer 103. So, for example, and as described for example in U.S. patent application Ser. No. 14/161,564, if the Al in the piezoelectric layer of a representative embodiment has an atomic percentage of approximately 95.0%, and the Sc has an atomic percentage of approximately 5.0%, then the atomic consistency of the piezoelectric layer 104 may then be represented as $Al_{0.95}Sc_{0.05}N$.

In certain representative embodiments, the BAW resonators of the present teachings comprise a recessed frame element disposed over a surface of at least one of the first and second electrodes. The area of the BAW resonator within the recessed frame element has a first acoustic impedance, the recessed frame element has a second acoustic impedance, and the region external to (i.e., "outside") the recessed frame element has a third acoustic impedance.

In other representative embodiments, the BAW resonators of the present teachings comprise a raised frame element disposed over a surface of at least one of the first and second electrodes. The area within the raised frame element has a first acoustic impedance, the raised frame element has a fourth acoustic impedance, and the region external to (i.e., "outside") the raised frame element has a third acoustic impedance.

In yet other representative embodiments, the BAW resonators of the present teachings comprise a recessed frame element disposed over a surface of at least one of the first and second electrodes and a raised frame element disposed over a surface of at least one of the first and second electrodes. The area of the BAW resonator within the recessed frame element has a first acoustic impedance, the recessed frame element has a second acoustic impedance, and the region external to (i.e., "outside") the recessed frame element has a third acoustic impedance. Moreover, the area within the raised frame element has the first acoustic impedance, the region external to the recessed frame element has the third acoustic impedance, and the raised frame element has the fourth acoustic impedance.

FIG. 1 is a cross-sectional view of a BAW resonator 100 according to a representative embodiment. The BAW resonator 100 comprises a substrate 101, a first electrode 102 disposed over the substrate 101, a piezoelectric layer 103 disposed over the first electrode 101, and a second electrode 104 disposed over the piezoelectric layer 103. The first electrode 101 is provided over a reflective element 105, which, in the present representative embodiment, is a cavity provided in the substrate 101.

As described in certain patents and patent application publications incorporated by reference above, an overlap of the reflective element 105, the first electrode 102, the second electrode 104 and the piezoelectric layer 103 comprises an active area of the BAW resonator 100. Moreover, when the reflective element 105 is a cavity or void beneath the first electrode, the BAW resonator 100 is often referred to as an FBAR. By contrast, as described below, the reflective element 105 may comprise a Bragg reflector, which comprises alternating layers of high acoustic impedance material and low acoustic impedance materials. When the reflective element 105 comprises a Bragg reflector, the BAW resonator 100 is often referred to as an SMR.

In accordance with representative embodiments, the piezoelectric layer 103 comprises a doped piezoelectric material. Illustratively, the piezoelectric material is doped AlN, wherein a number of Al atoms within the AlN crystal lattice are replaced with a selected material, such as a rare earth element at a predetermined percentage. The selected material, which is often referred to as a "doping element," may be, for example scandium (Sc). In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (not including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

Various embodiments relate to providing a thin film of piezoelectric material (piezoelectric layer 103), such as AlN, with an enhanced piezoelectric coefficient $d_{33}$ and an enhanced electromechanical coupling coefficient $kt^2$ by incorporating one or more rare earth elements into the crystal lattice of a portion of the piezoelectric layer. Illustratively, the piezoelectric layer may be a single layer including a substantially constant doping level throughout the thickness of the piezoelectric layer 103. Alternatively, the piezoelectric layer may be a single layer including different (e.g., graduated) levels of doping throughout the thickness of the piezoelectric layer 103. For example, the piezoelectric layer may include undoped AlN material at the bottom with gradually increasing atomic percentages of a rare earth element being added over the thickness of the piezoelectric layer 103. Still alternatively, the piezoelectric layer 103 may include multiple sub-layers (not shown), where at least one sub-layer is formed of stoichiometric AlN material (i.e., undoped AlN sub-layer) and at least one other sub-layer is formed of AlN material doped with a rare earth element (i.e., doped AlN sub-layer). By incorporating specific atomic percentages of the multiple rare earth elements, the piezoelectric properties of the AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing, for example.

As mentioned above, AlN material may be doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material. As such, electric dipoles of the piezoelectric material of piezoelectric layer 103 are altered in such way that electrical field produces a comparatively strong mechanical response of the dipoles, resulting in a higher $kt^2$.

Illustratively, the atomic percentage of scandium in an aluminum nitride layer (i.e., the atomic percent of Sc in Sc—Al inside the Al—Sc—N material) is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

The BAW resonator 100 optionally comprises a passivation layer 106 disposed over the second electrode 104, such as is described in the above-incorporated U.S. Pat. No. 8,188,810. Moreover, the BAW resonator 100 comprises first and second electrical contacts 107, 108, which provide electrical connection to the first and second electrodes 102, 104, respectively.

The BAW resonator 100 further comprises a recessed frame element 109 provided in the second electrode 104 (e.g., along the perimeter or periphery of the second electrode 104). Notably, placement of the recessed frame element 109 in the second electrode 104 is merely illustrative, and it is emphasized that the recessed frame element 109 may be disposed elsewhere on the acoustic stack comprising the first electrode 102, the piezoelectric layer 103 and the second electrode 104. For example, the recessed frame element 109 may be provided in the first electrode 102. More generally, the recessed frame element 109 is disposed over a surface of at least one of the first and second electrodes 102, 104. Furthermore, the recessed frame element 109 may comprise "fill material" (not shown) provided therein.

By selecting the location, width, depth and, if implemented, the composition of the fill material, the acoustic impedance discontinuity provided by the recessed frame element 109 may be selected. As such, the area of the BAW resonator "within" the recessed frame element 109 has a first acoustic impedance, the recessed frame element 109 has a second acoustic impedance, and the region external to (i.e., "outside") the recessed frame element 109 has a third acoustic impedance. As described, for example, in above-incorporated U.S. Pat. Nos. 7,280,0077, 7,388,454, and 7,714,684, the acoustic impedance mismatch provided by the recessed frame element 109 beneficially improves the performance of the BAW resonator 100. For example, and as described more fully below, the incorporation of the recessed frame element 109 in the BAW resonator 100 beneficially improves the quality factor (Q) in the southwest quadrant of a Smith Chart (often referred to as $Q_{sw}$), and reduces loss due to parasitic spurious modes at the perimeter of the active area of the BAW resonator 100 when compared with BAW resonators that do not include a recessed frame element. Moreover, the inclusion of the recessed frame element 109 provides some degree of improvement in $kt^2$, as well as a reduction in Q near series resonance ($Q_s$ near $F_s$). By contrast, while doping the piezoelectric layer 103 beneficially improves $kt^2$, this improvement often comes at a cost to other performance parameters (e.g., $Q_{sw}$). For example, and as described more fully below, recessed frame element 109 may be provided, inter alia, to compensate for degradations in certain performance parameters of the BAW resonator 100 that result from the inclusion of dopants in the piezoelectric layer 103 in the BAW resonator 100. Moreover, the location, width, depth and, if implemented, the composition of the fill material of the recessed frame element 109, are tailored to provide a desired degree of compensation of one or more performance parameters adversely impacted by the doping of the piezoelectric layer 103. Generally, the recessed frame element 109 of the representative embodiments has a width in the range of approximately 0.1 µm to approximately 5.0 µm and a depth in the range of approximately 50 Å to approximately 500 Å. Moreover, if implemented, the composition of the fill material for the recessed frame element 109 can be one of a selected metal (e.g. Mo, W, Al, Ru) or one of a selected dielectric material (e.g., AlN, $SiO_2$, $Si_3N_4$).

Figure 2:
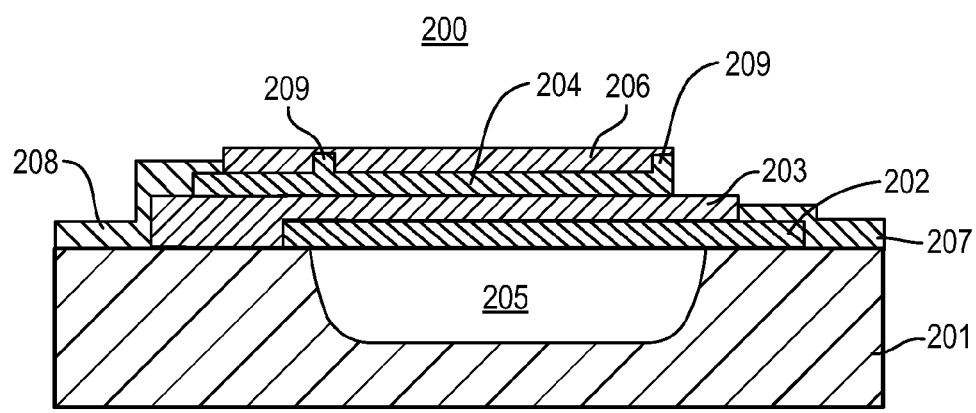
FIG. 2 is a cross-sectional view of a BAW resonator according to a representative embodiment.

FIG. 2 is a cross-sectional view of a BAW resonator 200 according to a representative embodiment. Certain details of the BAW resonator 200 are common to those provided above in connection with the description of BAW resonator 200, and are not always repeated to avoid obscuring the description of the presently described representative embodiment.

The BAW resonator 200 comprises a substrate 201, a first electrode 202 disposed over the substrate 201, a piezoelectric layer 203 disposed over the first electrode 202, and a second electrode 204 disposed over the piezoelectric layer 203. The first electrode 202 is provided over a reflective element 205, which, in the present representative embodiment, is a cavity provided in the substrate 201.

An overlap of the reflective element 205, the first electrode 202, the second electrode 204 and the piezoelectric layer 203 comprises an active area of the BAW resonator 200. Moreover, when the reflective element 205 is a cavity or void beneath the first electrode, the BAW resonator 200 is often referred to as an FBAR. By contrast, as described below, the reflective element 205 may comprise a Bragg reflector, which comprises alternating layers of high acoustic impedance material and low acoustic impedance materials.

In accordance with representative embodiments, the piezoelectric layer 203 comprises a doped piezoelectric material. Illustratively, the piezoelectric material is doped AlN, wherein a number of Al atoms within the AlN crystal lattice are replaced with a selected material, such as a rare earth element at a predetermined percentage. The selected material, which is often referred to as a "doping element," may be, for example scandium (Sc). In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (not including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

Various embodiments relate to providing a thin film of piezoelectric material (piezoelectric layer 203), such as AlN, with an enhanced piezoelectric coefficient $d_{33}$ and an enhanced electromechanical coupling coefficient $kt^2$ by incorporating one or more rare earth elements into the crystal lattice of a portion of the piezoelectric layer. Illustratively, the piezoelectric layer may be a single layer including a substantially constant doping level throughout the thickness of the piezoelectric layer 203. Alternatively, the piezoelectric layer may be a single layer including different (e.g., graduated) levels of doping throughout the thickness of the piezoelectric layer 203. For example, the piezoelectric layer may include undoped AlN material at the bottom with gradually increasing atomic percentages of a rare earth element being added over the thickness of the piezoelectric layer 203. Still alternatively, the piezoelectric layer 203 may include multiple sub-layers (not shown), where at least one sub-layer is formed of stoichiometric AlN material (i.e., undoped AlN sub-layer) and at least one other sub-layer is formed of AlN material doped with a rare earth element (i.e., doped AlN sub-layer). By incorporating specific atomic percentages of the multiple rare earth elements, the piezoelectric properties of the AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing, for example.

As mentioned above, the AlN material may be doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material.

Illustratively, the atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

The BAW resonator 200 optionally comprises a passivation layer 206 disposed over the second electrode 204, such as is described in the above-incorporated U.S. Pat. No. 8,188,810. Moreover, the BAW resonator 200 comprises first and second electrical contacts 207, 208, which provide electrical connection to the first and second electrodes 202, 204, respectively.

The BAW resonator 200 further comprises a raised frame element 209 provided over the second electrode 204. Notably, placement of the raised frame element 209 over the second electrode 204 is merely illustrative, and it is emphasized that the raised frame element 209 may be disposed elsewhere on the acoustic stack comprising the first electrode 202, the piezoelectric layer 203 and the second electrode 204. For example, the raised frame element 209 may be provided over the first electrode 202. More generally, the raised frame element 209 is disposed over a surface of at least one of the first and second electrodes 202, 204.

By selecting the location, width and height of the raised frame element 209, the acoustic impedance discontinuity provided by the raised frame element 209 may be selected. As such, the area within the raised frame element has the first acoustic impedance, the raised frame element has a fourth acoustic impedance, and the region external to (i.e., "outside") the raised frame element has the third acoustic impedance. As described, for example, in above-incorporated U.S. Pat. Nos. 7,280,007, 7,388,454, and 7,714,684, the acoustic impedance mismatch provided by the raised frame element 209 beneficially improves the performance of the BAW resonator 200. For example, and as described more fully below, the incorporation of the raised frame element 209 in the BAW resonator 200 beneficially improves the quality factor at parallel resonance ($Q_p$), and desirably increases the real part of the impedance at parallel resonance ($R_p$) when compared with BAW resonators that do not include a raised frame element. However, these improvements in $Q_p$ and $R_p$ often come at a cost to other performance parameters (e.g., $Q_{sw}$), and the incidence of parasitic spurious modes in the southwest quadrant of the Smith Chart, which are manifest as "rattles" thereon. As described more fully below, the location, width, height and, composition of the material of the raised frame element 209 are tailored to provide a desired degree of improvement of $Q_p$ and $R_p$, and certain degradations in performance in the southwest quadrant of the Smith Chart due to the raised frame element 209 can be compensated by other techniques in accordance with representative embodiments. Generally, the raised frame element 209 of the representative embodiments has a width in the range of approximately 0.1 µm to approximately 10.0 µm and a height in the range of approximately 100 Å to approximately 3000 Å. Moreover, the material selected for the raised frame element 209 is not necessarily of the same composition as the second electrode 204. Illustratively, the composition of the material used for the raised frame element 209 can be one of a selected metal (e.g. Mo, W, Al, Ru) or one of a selected dielectric material (e.g., AlN, $SiO_2$, $Si_3N_4$).

Figure 3A:
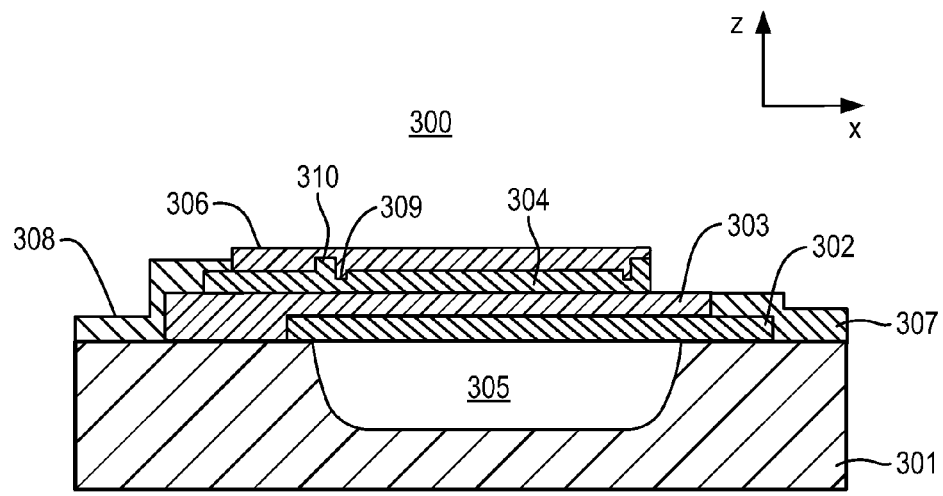
FIG. 3A is a cross-sectional view of a BAW resonator according to a representative embodiment.

FIG. 3A is a cross-sectional view of a BAW resonator 300 according to a representative embodiment. Certain details of the BAW resonator 300 are common to those provided above in connection with the description of BAW resonators 100, 200, and are not always repeated to avoid obscuring the description of the presently described representative embodiment.

The BAW resonator 300 comprises a substrate 301, a first electrode 302 disposed over the substrate 301, a piezoelectric layer 303 disposed over the first electrode 302, and a second electrode 304 disposed over the piezoelectric layer 303. The first electrode 302 is provided over a reflective element 305, which, in the present representative embodiment, is a cavity provided in the substrate 301.

An overlap of the reflective element 305, the first electrode 302, the second electrode 304 and the piezoelectric layer 303 comprises an active area of the BAW resonator 300. Moreover, when the reflective element 305 is a cavity or void beneath the first electrode, the BAW resonator 300 is often referred to as an FBAR. By contrast, as described below, the reflective element 305 may comprise a Bragg reflector, which comprises alternating layers of high acoustic impedance materials and low acoustic impedance materials.

In accordance with representative embodiments, the piezoelectric layer 303 comprises a doped piezoelectric material. Illustratively, the piezoelectric material is doped AlN, wherein a number of Al atoms within the AlN crystal lattice are replaced with a selected material, such as a rare earth element at a predetermined percentage. The selected material, which is often referred to as a "doping element," may be, for example scandium (Sc). In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (not including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

Various embodiments relate to providing a thin film of piezoelectric material (piezoelectric layer 303), such as AlN, with an enhanced piezoelectric coefficient $d_{33}$ and an enhanced electromechanical coupling coefficient $kt^2$ by incorporating one or more rare earth elements into the crystal lattice of a portion of the piezoelectric layer. Illustratively, the piezoelectric layer may be a single layer including a substantially constant doping level throughout the thickness of the piezoelectric layer 303. Alternatively, the piezoelectric layer may be a single layer including different (e.g., graduated) levels of doping throughout the thickness of the piezoelectric layer 303. For example, the piezoelectric layer may include undoped AlN material at the bottom with gradually increasing atomic percentages of a rare earth element being added over the thickness of the piezoelectric layer 303. Still alternatively, the piezoelectric layer 303 may include multiple sub-layers (not shown), where at least one sub-layer is formed of stoichiometric AlN material (i.e., undoped AlN sub-layer) and at least one other sub-layer is formed of AlN material doped with a rare earth element (i.e., doped AlN sub-layer). By incorporating specific atomic percentages of the multiple rare earth elements, the piezoelectric properties of the AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing, for example.

As mentioned above, the AlN material may be doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material.

Illustratively, the atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%.

The BAW resonator 300 optionally comprises a passivation layer 306 disposed over the second electrode 304, such as is described in the above-incorporated U.S. Pat. No. 8,188,810. Moreover, the BAW resonator 300 comprises first and second electrical contacts 307, 308, which provide electrical connection to the first and second electrodes 302, 304, respectively.

The BAW resonator 300 further comprises a recessed frame element 309 provided in the second electrode 304. Notably, placement of the recessed frame element 309 in the second electrode 304 is merely illustrative, and it is emphasized that the recessed frame element 309 may be disposed elsewhere on the acoustic stack comprising the first electrode 302, the piezoelectric layer 303 and the second electrode 304. For example, the recessed frame element 309 may be provided in the first electrode 302. More generally, the recessed frame element 309 is disposed over a surface of at least one of the first and second electrodes 302, 304. Furthermore, the recessed frame element 309 may comprise "fill material" (not shown) provided therein.

As noted above, by selecting the location, width, depth and, if implemented, the composition of the fill material, the acoustic impedance discontinuity provided by the recessed frame element 309 may be selected. As such, the area of the BAW resonator "within" the recessed frame element 309 has the first acoustic impedance, the recessed frame element 309 has the second acoustic impedance, and the region external to (i.e., "outside") the recessed frame element 309 has the third acoustic impedance. As noted above, the acoustic impedance mismatch provided by the recessed frame element 309 beneficially improves the performance of the BAW resonator 300. For example, and as described more fully below, the incorporation of the recessed frame element 309 in the BAW resonator 300 beneficially improves the quality factor (Q) in the southwest quadrant of a Smith Chart (often referred to as $Q_{sw}$), and reduces the incidence of parasitic spurious modes at the perimeter of the resonator of the active area of the BAW resonator 300 when compared with BAW resonators that do not include a recessed frame element. Moreover, the inclusion of the recessed frame element 309 provides some degree of improvement in $kt^2$, as well as a reduction in near series resonance ($Q_s$ near $F_s$). By contrast, white doping the piezoelectric layer 103 beneficially improves $kt^2$, this improvement often comes at a cost to other performance parameters (e.g., $Q_{sw}$). For example, and as described more fully below, recessed frame element 109 may be provided, inter alia, to compensate for degradations in certain performance parameters of the BAW resonator 300 that result from the inclusion of dopants in the piezoelectric layer 303 in the BAW resonator 300. Moreover, the location, width, depth and, if implemented, the composition of the fill material of the recessed frame element 309, are tailored to provide a desired degree of compensation of one or more performance parameters adversely impacted by the doping of the piezoelectric layer 303.

The BAW resonator 300 further comprises a raised frame element 310 provided over the second electrode 304. Notably, placement of the raised frame element 310 over the second electrode 304 is merely illustrative, and it is emphasized that the raised frame element 310 may be disposed elsewhere on the acoustic stack comprising the first electrode 302, the piezoelectric layer 303 and the second electrode 304. For example, the raised frame element 310 may be provided over the first electrode 302. More generally, the raised frame element 310 is disposed over a surface of at least one of the first and second electrodes 302, 304.

By selecting the location, width and height of the raised frame element 310, the acoustic impedance discontinuity provided by the raised frame element 310 may be selected. As such, the area within the raised frame element has the first acoustic impedance, the raised frame element has a fourth acoustic impedance, and the region external to (i.e., "outside") the raised frame element has the third acoustic impedance. As described above, the acoustic impedance mismatch provided by the raised frame element 310 beneficially improves the performance of the BAW resonator 300. For example, and as described more fully below, the incorporation of the raised frame element 310 in the BAW resonator 300 beneficially improves the quality factor at parallel resonance ($Q_p$), and desirably increases the real part of the impedance at parallel resonance ($R_p$) when compared with BAW resonators that do not include a raised frame element. However, these improvements in $Q_p$ and $R_p$ often come at a cost to other performance parameters (e.g., $Q_{sw}$), and the incidence parasitic spurious modes in the southwest quadrant of the Smith Chart, which are manifest as "rattles" thereon. As described more fully below, the location, width, height and composition of the material of the raised frame element 310 are tailored to provide a desired degree of improvement of $Q_p$ and $R_p$, and certain degradations in performance in the southwest quadrant of the Smith Chart due to the raised frame element 310 can be compensated by other techniques in accordance with representative embodiments.

As noted above, it is beneficial to include rare-earth element dopants (e.g., Sc) in the piezoelectric material of piezoelectric layer 303 to improve $kt^2$ of the BAW resonator 300. However, this improvement in $kt^2$ realized at the expense of a degradation in $Q_{sw}$, which is inversely proportional to $kt^2$. As such, any incremental improvement in $kt^2$ results in a proportional reduction in $Q_{sw}$. However, the inclusion of recessed frame element 309 results in an improvement in $Q_{sw}$ and a reduction in losses due to parasitic spurious modes at the perimeter of the active area of the BAW resonator. Moreover, and as noted above, the inclusion of recessed frame element 309 results in an additional increase in $kt^2$, albeit a small increase in comparison to the improvement of $kt^2$ resulting from the doping of piezoelectric layer 303. Furthermore, as noted above, the inclusion of the raised frame element 310 provides a desirable improvement in $Q_p$ and $R_p$, albeit at the cost of degradation in $kt^2$, albeit at the cost of a degradation in $Q_{sw}$, increased losses due to parasitic spurious modes in the southwest quadrant of the Smith Chart. Beneficially, however, as noted above, the inclusion of the recessed frame element 309 results in an improvement in $Q_{sw}$ and a reduction in losses due to parasitic spurious modes in the southwest quadrant of the Smith Chart. Accordingly, by including both the recessed frame element 309 and the raised frame element 310 in the BAW resonator 300 comprising a doped piezoelectric layer 303, there is an overall improvement in $Q_p$ and $R_p$ (due to the raised frame element 310), an overall increase in $Q_{sw}$ and a reduction in losses due to parasitic spurious modes in the southwest quadrant of the Smith Chart (due to the recessed frame element 309), and an overall improvement in $kt^2$ (due to the doped piezoelectric layer 303 and the recessed frame element) when compared to a known BAW resonator that does not include one or more of these components.

Figure 3B:
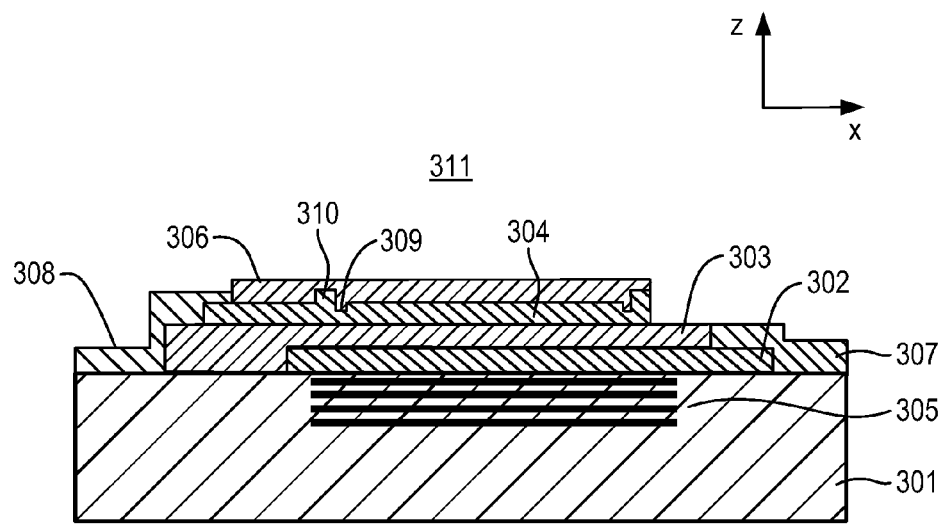
FIG. 3B is a cross-sectional view of a BAW resonator according to a representative embodiment.

FIG. 3B is a cross-sectional view of a BAW resonator 311 according to a representative embodiment. Certain details of the BAW resonator 311 are common to those provided above in connection with the description of BAW resonators 100, 200, 300 and are not always repeated to avoid obscuring the description of the presently described representative embodiment. Most notably, the BAW resonator 311 comprises reflective element 305 that is a so-called Bragg reflector or Bragg mirror and comprises a plurality of alternating low acoustic impedance and high acoustic impedance layers. Otherwise, the BAW resonator 311 is substantively identical to BAW resonator 300 described in connection with FIG. 3A, and its description is not repeated. Moreover, the details and fabrication of the Bragg reflector that forms the reflective element 305 of the representative embodiment of FIG. 3B are known and are not repeated.

Figure 4A:
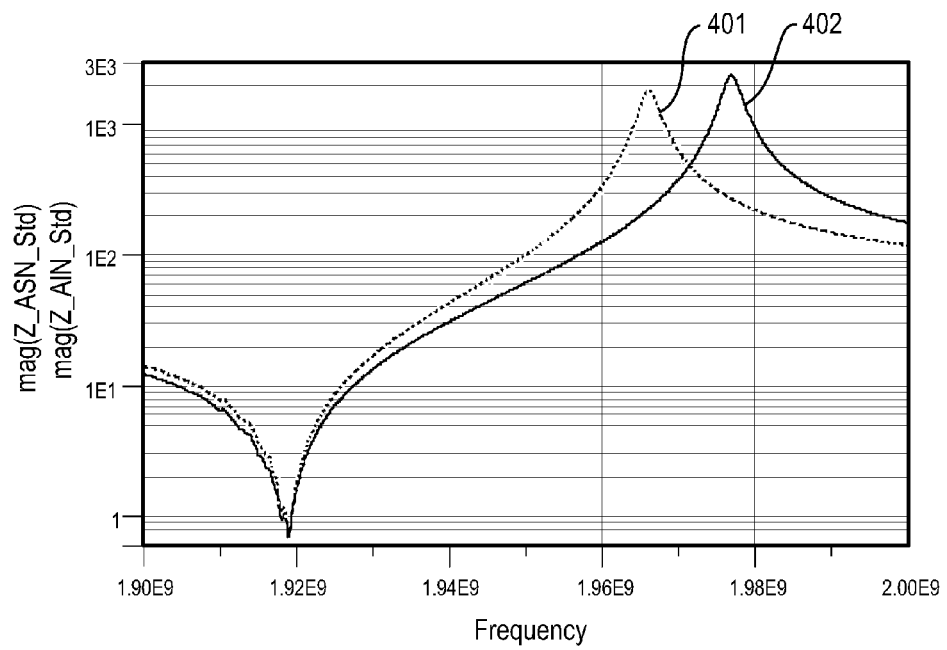
FIG. 4A is a graph illustrating the electromechanical coupling coefficient ($kt^2$) of a BAW resonator comprising no dopants in a piezoelectric layer and the $kt^2$ of a BAW resonator comprising dopants in the piezoelectric layer.

FIG. 4A is a graph illustrating the electromechanical coupling coefficient ($kt^2$) versus frequency of a BAW resonator comprising no dopants in a piezoelectric layer (curve 401—dotted line) and the $kt^2$ of a BAW resonator comprising dopants in the piezoelectric layer (curve 402—solid line). Notably, the electromechanical coupling coefficient ($kt^2$) depicted in FIG. 4A is for BAW resonators that do not comprise either a recessed frame element or a raised frame element, such as described above in connections with FIGS. 1-3B. FIG. 4A depicts the significant improvement in $kt^2$ over a particular frequency range that is realized through the inclusion of rare-earth dopants (e.g., Sc) in a piezoelectric layer (e.g., AlN). Notably, FIG. 4A depicts $kt^2$ over a particular frequency range for a Se-doped AlScN piezoelectric layer in which the Sc is generally uniformly distributed in the AlScN piezoelectric layer, and the atomic percentage of Sc is in the range of approximately 1.5% to approximately 5.0%.

Figure 4B:
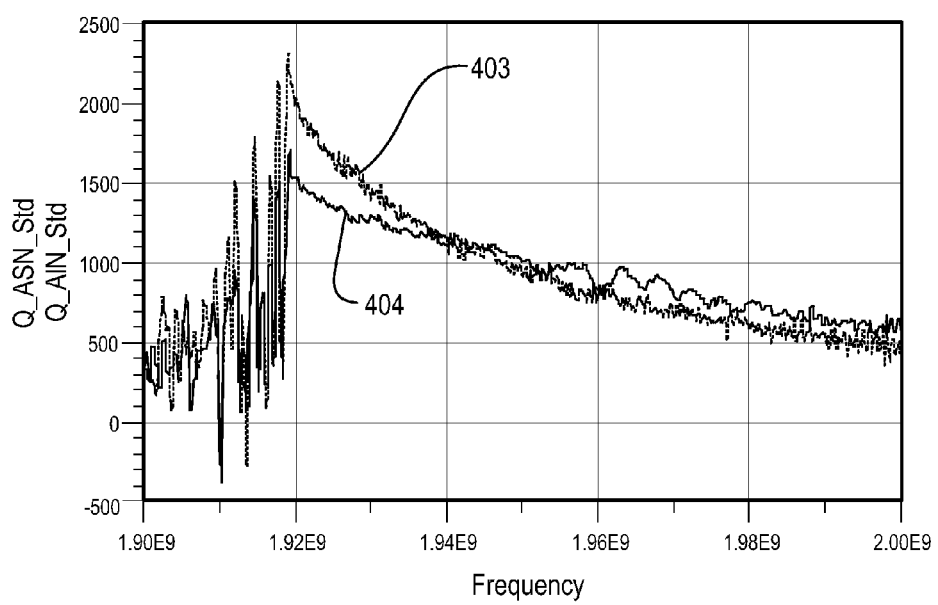
FIG. 4B is a graph illustrating the quality factor (Q) of a BAW resonator comprising no dopants in a piezoelectric layer and the Q of a BAW resonator comprising dopants in the piezoelectric layer.

As noted above, an increase in $k'^2$, while beneficial to the performance of a BAW resonator, is realized at the expense of a decrease in the Q of the BAW resonator, particularly, as described more fully below, $Q_p$ and $Q_{sw}$. As such, introduction of dopants to the piezoelectric layer of a BAW resonator results in an overall reduction in Q of the BAW resonator. FIG. 4B depicts this degradation in Q over a frequency range of interest. Notably, FIG. 4B depicts Q versus frequency for a BAW resonator comprising no dopants in a piezoelectric layer (curve 403—dotted line) and the $k'^2$ of a BAW resonator comprising dopants in the piezoelectric layer (curve 404—solid line). The Q depicted in FIG. 4B is for the BAW resonators for which $k'^2$ is depicted in FIG. 4A. FIG. 4B depicts the degradation in Q over a particular frequency range that is realized through the inclusion of rare-earth dopants (e.g., Sc) in a piezoelectric layer (e.g., AlN).

A quantitative and qualitative understanding of the Q of a resonator may be obtained by plotting on a Smith Chart the ratio of the reflected energy to applied energy ($S_{11}$) as the frequency is varied for the case in which one electrode is connected to ground and another to signal, for a BAW resonator with an impedance equal to the system impedance at the resonant frequency. As the frequency of the applied energy is increased, the magnitude/phase of the BAW resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith Chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith Chart, the higher the Q-factor of the device. The Q-circle of an ideal lossless resonator would have a radius of one and would be at the edge of the Smith Chart. However, as noted above, there are energy losses that impact the Q-factor of the device. For instance, and in addition to the sources of acoustic losses mentioned above, Rayleigh-Lamb (lateral or spurious) modes are in the x,y dimensions. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective velocities between the regions where electrodes are disposed and the surrounding regions of the resonator where there are no electrodes.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic tosses sharp reductions in Q can be observed on a Q-circle of the Smith Chart of the $S_{11}$ parameter. These sharp reductions in Q-factor are known as "rattles" or "loop-de-loops," which are shown and described below.

Figure 5:
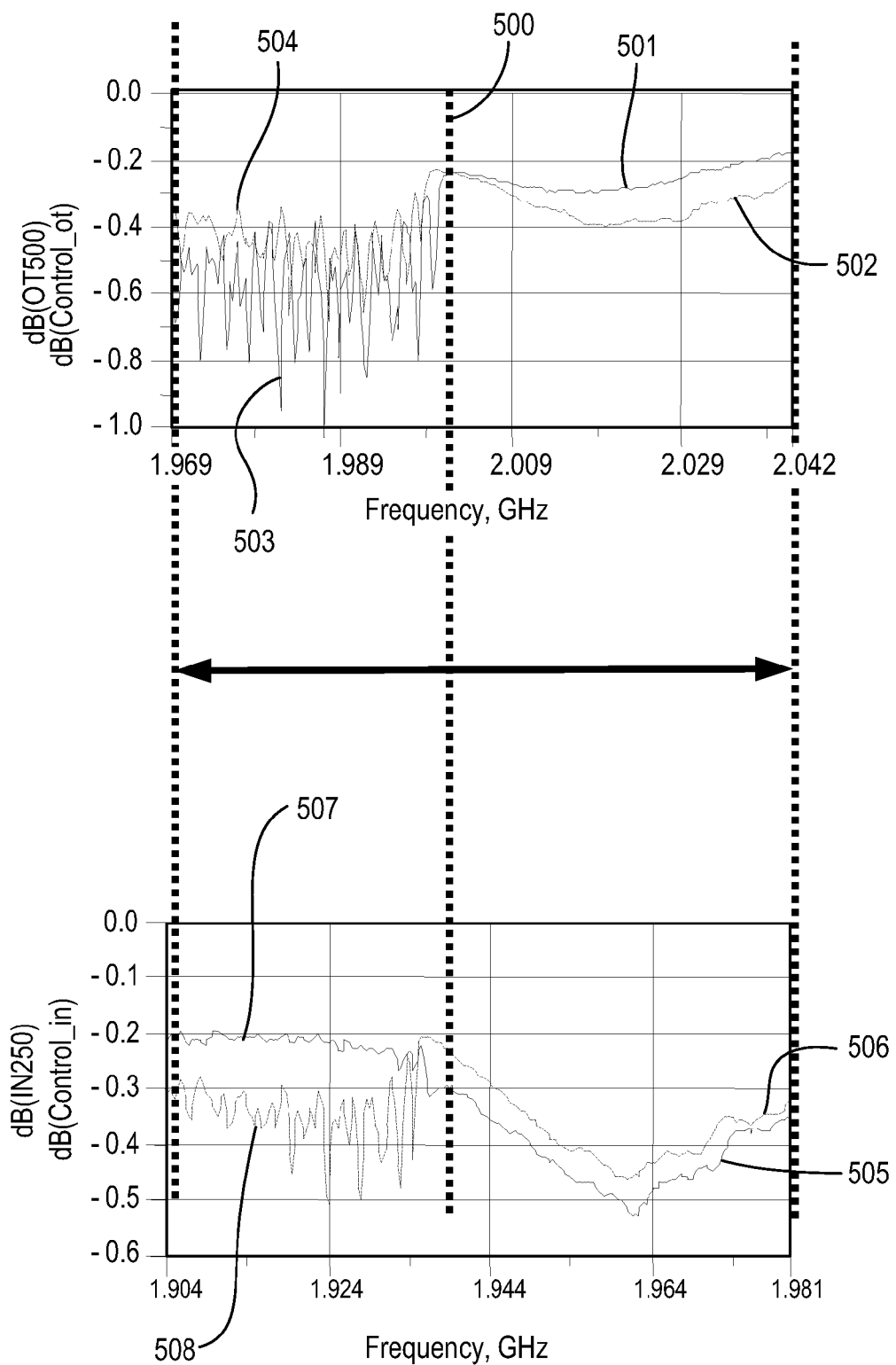
FIG. 5 is a graph illustrating the impact of a raised frame element and of a recessed frame element on a BAW resonator comprising no dopants in a piezoelectric layer and a BAW resonator comprising dopants in the piezoelectric layer.

FIG. 5 is a graph illustrating the impact of a raised frame element and of a recessed frame element on a BAW resonator comprising no dopants in a piezoelectric layer and a BAW resonator comprising dopants in the piezoelectric layer. Notably, FIG. 5 depicts $S_{11}$ versus frequency and includes correlations to a Smith Chart. Most notably, line 500 depicts vertically the horizontal bisector (the real axis) a Smith Chart with $f_s$ at one end and $f_p$ at the other end of the horizontal line.

Curve 501 depicts $S_{11}$ for a BAW resonator comprising a doped piezoelectric layer and a raised frame element. So, by way of example, curve 501 (solid line) depicts $S_{11}$ for BAW resonator 200 described above in connection with FIG. 2. Curve 502 (dotted line) depicts $S_{11}$ for a BAW resonator having the same doped piezoelectric layer as that of the BAW resonator for which $S_{11}$ is depicted in curve 501, but without the raised frame element. As can be appreciated, in the region to the right of line 500, curve 501 is greater than curve 502, and in a particular frequency range, there is a significant increase in $S_{11}$ for the BAW resonator comprising a raised frame element compared to the BAW resonator that does not. This improvement in $S_{11}$ is manifest in an improved $Q_p$ (and $R_p$) for the BAW resonator comprising the raised frame element compared to the BAW resonator that does not.

The region to the left of line 500 depicts $S_{11}$ versus frequency in the southwest quadrant of the Smith Chart. Notably, in the region to the left of line 500, there is degradation in $Q_{sw}$ for the BAW resonator comprising the raised frame element when compared to the BAW resonator that does not comprise the raised frame element. Curve 504 (solid line) depicts $S_{11}$ for the BAW resonator without the raised frame element, whereas curve 505 (dotted line) depicts $S_{11}$ for the BAW resonator comprising the raised frame element. As can be appreciated from a review of curves 504 and 505, not only is the magnitude of $S_{11}$ in the southwest quadrant lower for the BAW resonator comprising the raise frame element, the fluctuations in $S_{11}$ are greater, indicating increased losses due to spurious modes (manifest as "rattles" or "loop-de-loops on a Smith Chart).

So, while the BAW resonator having a doped piezoelectric layer and a raised frame element realizes an improved $Q_r$, and $R_p$, this comes at the expense of degradation in $Q_{sw}$ and increased losses to spurious modes.

Curve 505 depicts $S_{11}$ for a BAW resonator comprising a doped piezoelectric layer and a recessed frame element. So, by way of example, curve 505 (solid line) depicts $S_{11}$ for a BAW resonator such as BAW resonator 100 described above in connection with FIG. 1. Curve 506 (dotted line) depicts $S_{11}$ fix a BAW resonator having the same doped piezoelectric layer as that of the BAW resonator for which $S_{11}$ is depicted in curve 501, but without the recessed frame element. As can be appreciated, in the region to the right of line 500, curve 505 is lower than curve 506. As such, in a particular frequency range there is a decrease in $S_{11}$ for the BAW resonator comprising a recessed frame element compared to the BAW resonator that does not include the recessed frame element.

The region to the left of line 500 depicts $S_{11}$ versus frequency in the southwest quadrant of the Smith Chart. Notably, in the region to the left of line 500, there is improvement in $Q_{sw}$ for the BAW resonator comprising the raised frame element when compared to the BAW resonator that does not comprise the raised frame element. Curve 507 (solid line) depicts $S_{11}$ for the BAW resonator with the recessed frame element, whereas curve 508 (dotted line depicts $S_{11}$ for the BAW resonator without the recessed frame element. As can be appreciated from a review of curves 504 and 505, the magnitude of $S_{11}$ in the southwest quadrant lower for the BAW resonator comprising the recessed frame element is improved compared to that of the BAW resonator that does not include the recessed frame element. Moreover, the not only is the magnitude of $S_{11}$ in the southwest quadrant greater for the BAW resonator comprising the recessed frame element, the fluctuations in $S_{11}$ are less severe, indicating lower losses due to spurious modes (manifest as "rattles" or "loop-de-loops on a Smith Chart).

So, while the BAW resonator having a doped piezoelectric layer and a recessed frame element has a somewhat degraded $Q_p$ and $R_p$ compared to the BAW resonator that does not, there is a beneficial improvement in $Q_{sw}$ and decreased losses to spurious modes.

In accordance with a representative embodiment, a BAW resonator comprising a doped piezoelectric layer, a raised frame element, and a recessed frame element provides an overall improvement in $Q_p$ and $R_p$ and an improvement in $Q_{sw}$ and a decrease in losses to spurious modes. Specifically, the degradation in $Q_p$ and $R_p$ that can result from the use of the doped piezoelectric layer and the recessed frame element is more than offset by the improvements in $Q_p$ and $R_p$ realized from the use of a raised frame element. Moreover, the degradation in $Q_{sw}$ and increased losses to spurious modes that can result from the use of the doped piezoelectric layer and the raised frame element is more than offset by the improvements in $Q_{sw}$ and spurious mode losses realized from the inclusion of a recessed frame element.

Figure 6A:
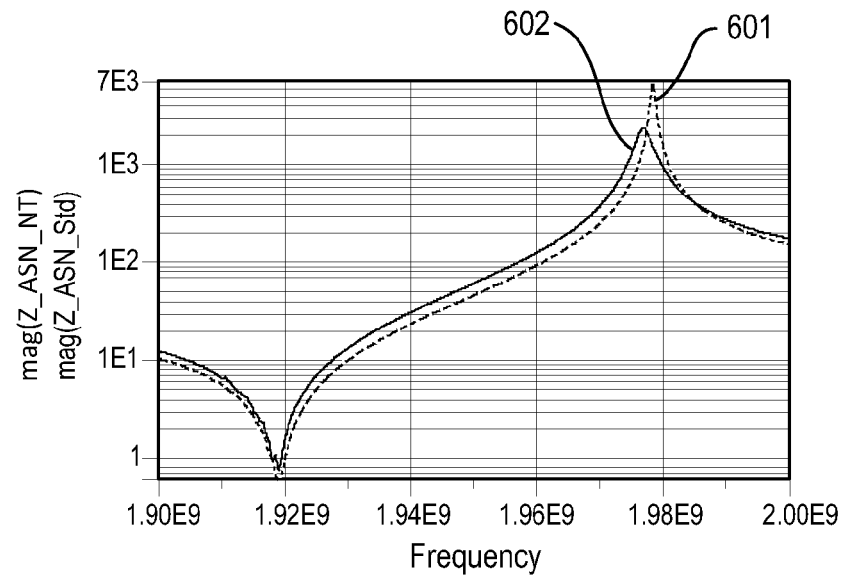
FIG. 6A is a graph illustrating the impact of a raised frame element and of a recessed frame element on the parallel resonance impedance ($R_p$) and on the series resonance impedance ($R_s$) on a BAW resonator comprising dopants in the piezoelectric layer.

FIG. 6A is a graph illustrating the electromechanical coupling coefficient ($kt^2$) versus frequency of a BAW resonator comprising a doped piezoelectric layer, a raised frame element and a recessed frame element (curve 601—dotted line), and the $kt^2$ of a BAW resonator comprising dopants in the piezoelectric layer but including neither a raised frame element nor a recessed frame element (curve 602—solid line). As such, curve 601 depicts $kt^2$ versus frequency for a BAW resonator such as BAW resonator 300 or BAW resonator 311 with selected dopant(s), doping levels, and raised and recessed frame elements of a representative embodiment. Illustratively, the piezoelectric layer comprises Sc-doped AlN. Notably, FIG. 6A depicts $kt^2$ over a particular frequency range for a Sc-doped AlScN piezoelectric layer in which the Sc is generally uniformly distributed in AlScN piezoelectric layer, and the atomic percentage of Sc is in the range of approximately 1.5% to approximately 5.0%.

As discussed above, a significant increase in $kt^2$ over a particular frequency range can be attributed to the doping of the piezoelectric layer, and, to a lesser extent, an increase $kt^2$ over a particular frequency range can be attributed to the inclusion of a recessed frame element in the BAW resonator structure. Generally, the improvement in $kt^2$ that can be attributed to recessed frame element is approximately 10% of the improvement in $kt^2$ that can be attributed the doping of the piezoelectric layer of the BAW resonator.

Figure 6B:
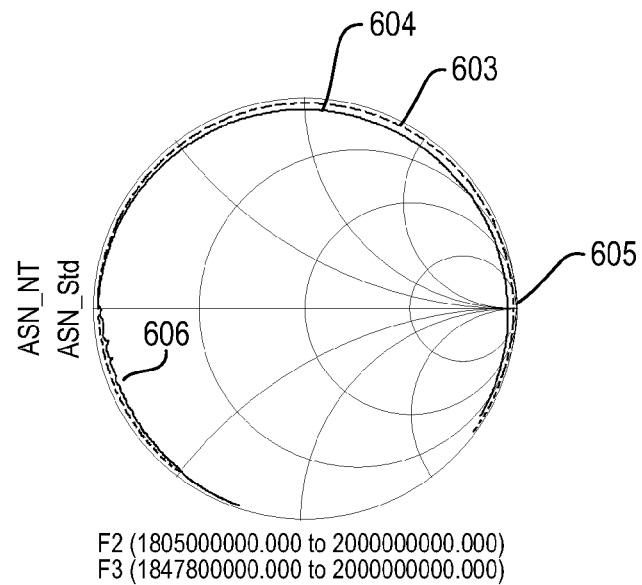
FIG. 6B is a Smith Chart illustrating the impact of a raised frame element and of a recessed frame element on the Q in the southwest quadrant ($Q_{sw}$) and on the spurious modes in the southwest quadrant of the Smith Chart in a BAW resonator comprising dopants in the piezoelectric layer.

FIG. 6B is a Smith Chart depicting a Q-circle (curve 603—dashed line) of a BAW resonator comprising a doped piezoelectric layer, a raised frame element and a recessed frame element, and a Q-circle of a BAW resonator comprising dopants in the piezoelectric layer but including neither a raised frame element nor a recessed frame element (curve 604—solid line). As such, curve 603 depicts the Q-circle for a BAW resonator such as BAW resonator 300 or BAW resonator 311 with selected dopant(s), doping levels, and raised and recessed frame elements of a representative embodiment. Illustratively, the piezoelectric layer comprises Sc-doped AlN.

As can be appreciated from a review of FIG. 6B, curve 603 "hugs" the unit-Q-circle more so than curve 604, indicating that an overall improvement in Q is realized through the inclusion of both the raised frame element and the recessed frame element when the piezoelectric layer comprises a dopant.

As depicted at point 605 on curve 603, $Q_p$ is beneficially improved. As noted above, this overall improvement of $Q_p$ (and thus $R_p$) can be attributed to the inclusion of the raised frame element in the BAW resonator comprising a doped piezoelectric layer. Specifically, the degradation in $Q_p$ and $R_p$ that can result froth the use of the doped piezoelectric layer and the recessed frame element is more than offset by the improvements in $Q_p$ and $R_p$ realized from the use of a raised frame element.

Moreover, in the southwest quadrant, there is not only a comparative improvement in Q ($Q_{sw}$), but also a significant reduction in "rattles" and "loop-de-loops" in the BAW resonator comprising a doped piezoelectric layer, a raised frame element and a recessed frame element. Specifically, in region 606 of the Smith Chart, curve 604 remains closer to the unit circle, and has few, if any, "rattles" or "loop-de-loops." As such, the BAW resonator comprising a doped piezoelectric layer, a raised frame element and a recessed frame element exhibits an improvement in $Q_{sw}$ and a reduction in losses due to spurious modes when compared to a HAW resonator that includes a doped piezoelectric layer, but neither a raised frame element nor a recessed frame element. Accordingly, the degradation in $Q_{sw}$ and increased losses to spurious modes that can result from the use of the doped piezoelectric layer and the raised frame element in the BAW resonator is more than offset by the improvements in $Q_{sw}$ and spurious mode losses realized from the inclusion of a recessed frame element.

Figure 7:
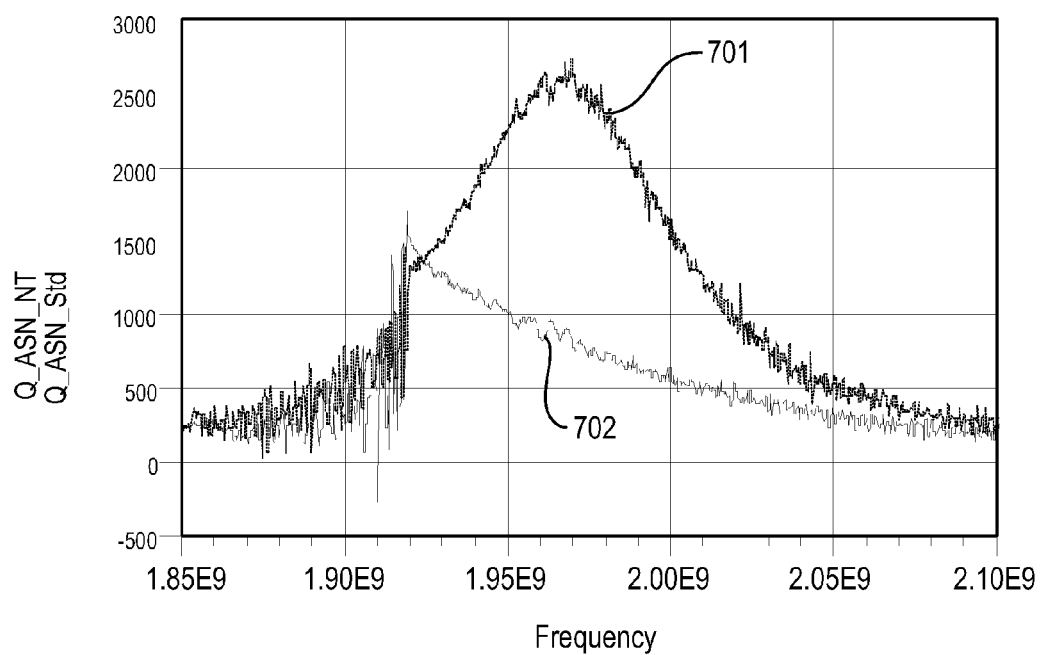
FIG. 7 is a graph illustrating the impact of a raised frame element and of a recessed frame element on the Q of a BAW resonator comprising dopants in the piezoelectric layer.

FIG. 7 is a graph illustrating the impact of a raised frame element and of a recessed frame element on the Q of a BAW resonator comprising dopants in the piezoelectric layer. Notably, FIG. 7 depicts Q over a particular frequency range for a BAW resonator comprising an Sc-doped AlScN piezoelectric layer in which the Sc is generally uniformly distributed in AlScN piezoelectric layer, and the atomic percentage of Sc is in the range of approximately 1.5% to approximately 5.0%. (see previous comments). Specifically, FIG. 7 depicts Q versus frequency (curve 701—dotted line) of a BAW resonator comprising a doped piezoelectric layer, a raised frame element and a recessed frame element, and Q versus frequency (curve 702) of a BAW resonator comprising dopants in the piezoelectric layer but including neither a raised frame element nor a recessed frame element (curve 604—solid line), As such, curve 701 depicts Q versus frequency for a BAW resonator such as BAW resonator 300 or BAW resonator 311 with selected dopant(s), doping levels, and raised and recessed frame elements of a representative embodiment. Illustratively, the piezoelectric layer comprises Sc-doped AlN. As can be appreciated from a review of FIG. 7, the BAW resonator comprising a doped piezoelectric layer, a raised frame element and a recessed frame element realizes a significant improvement in overall Q over a fairly large frequency range compared to a BAW resonator comprising dopants in the piezoelectric layer but including neither a raised frame element nor a recessed frame element.

In accordance with representative embodiments, BAW resonators comprising doped piezoelectric layers, a raised frame element, or a recessed frame element, or both, are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator comprising:
a first electrode;
a second electrode;
a piezoelectric layer disposed between the first and second electrodes, the piezoelectric layer comprising a piezoelectric material doped with two or more rare earth elements incorporated into a crystal lattice of the piezoelectric material; and
a recessed frame element disposed over a surface of at least one of the first and second electrodes.

2. A BAW resonator as claimed in claim 1, wherein the recessed frame element is disposed along a periphery of the second electrode.

3. A BAW resonator as claimed in claim 1, wherein the recessed frame element is disposed within the first electrode and directly opposes a periphery of the second electrode.

4. A BAW resonator as claimed in claim 1, wherein the recessed frame element is integrated into the one of the first and second electrodes.

5. A BAW resonator as claimed in claim 1, further comprising a reflective element disposed beneath the first electrode, the second electrode and the piezoelectric layer, wherein an overlap of the reflective element, the first electrode, the second electrode and the piezoelectric layer defines an active area of the BAW resonator.

6. A BAW resonator as claimed in claim 5, wherein the reflective element comprises a cavity disposed in a substrate over which the first electrode, the second electrode and the piezoelectric layer are disposed.

7. A BAW resonator as claimed in claim 5, wherein the reflective element comprises a plurality of layers having alternating high acoustic impedance and low acoustic impedance.

8. A BAW resonator as claimed in claim 1, wherein the piezoelectric material comprises aluminum nitride (AlN).

9. A BAW resonator as claimed in claim 8, wherein the two or more rare earth elements comprise scandium (Sc).

10. A BAW resonator as claimed in claim 1, wherein the two or more rare earth elements comprise scandium (Sc) and erbium (Er).

11. A BAW resonator as claimed in claim 10, wherein the two or more rare earth elements further comprise yttrium (Y).

12. A BAW resonator as claimed in claim 1, further comprising a raised frame element disposed over a surface of at least one of the first and second electrodes.

13. A BAW resonator as claimed in claim 12, wherein the piezoelectric material comprises aluminum nitride (AlN).

14. A BAW resonator as claimed in claim 13, wherein the two or more rare earth elements comprise scandium (Sc).

15. A BAW resonator as claimed in claim 13, wherein the two or more rare earth elements comprise scandium (Sc) and erbium (Er).

16. A BAW resonator as claimed in claim 15, wherein the two or more rare earth elements comprise yttrium (Y).

17. A bulk acoustic wave (BAW) resonator comprising:
a first electrode;
a second electrode;
a piezoelectric layer disposed between the first and second electrodes, the piezoelectric layer comprising a piezoelectric material doped with two or more rare earth elements incorporated into a crystal lattice of the piezoelectric material; and
a raised frame element disposed over a surface of at least one of the first and second electrodes.

18. A BAW resonator as claimed in claim 17, wherein the raised frame element is disposed along a periphery of the second electrode.

19. A BAW resonator as claimed in claim 17, wherein the raised frame element is disposed within the first electrode and directly opposes a periphery of the second electrode.

20. A BAW resonator as claimed in claim 17, wherein the raised frame element is integrated into the one of the first and the second electrodes.

21. A BAW resonator as claimed in claim 17, further comprising a reflective element disposed beneath the first electrode, the second electrode and the piezoelectric layer, wherein an overlap of the reflective element, the first electrode, the second electrode and the piezoelectric layer defines an active area of the BAW resonator.

22. A BAW resonator as claimed in claim 21, wherein the reflective element comprises a cavity disposed in a substrate over which the first electrode, the second electrode and the piezoelectric layer are disposed.

23. A BAW resonator as claimed in claim 21, wherein the reflective element comprises a plurality of layers having alternating high acoustic impedance and low acoustic impedance.

24. A BAW resonator as claimed in claim 17, wherein the piezoelectric material comprises aluminum nitride (AlN).

25. A BAW resonator as claimed in claim 24, wherein the two or more rare earth elements comprise scandium (Sc).

26. A BAW resonator as claimed in claim 17, wherein the two or more rare earth elements comprise scandium (Sc) and erbium (Er).

27. A BAW resonator as claimed in claim 26, wherein the two or more rare earth elements further comprise yttrium (Y).

* * * * *